United States Patent [19]

Kaufmann et al.

[11] Patent Number: 5,229,570
[45] Date of Patent: Jul. 20, 1993

[54] METHOD OF AN APPARATUS FOR A CENTERING OF AN ELECTRON BEAM

[75] Inventors: Helmut Kaufmann, Fürstentum, Liechtenstein; Roland Schmid, Göfis, Austria

[73] Assignee: Balzers Aktiengesellschaft, Furstentum, Liechtenstein

[21] Appl. No.: 795,722

[22] Filed: Nov. 21, 1991

[30] Foreign Application Priority Data

Dec. 13, 1990 [CH] Switzerland ............... 3955/90

[51] Int. Cl.$^5$ ............................................. B23K 15/00
[52] U.S. Cl. .......................... 219/121.28; 219/121.23
[58] Field of Search ............. 219/121.23, 121.28, 219/121.15, 121.13, 121.68, 121.69; 427/53.1; 250/397

[56] References Cited

U.S. PATENT DOCUMENTS 5,001,403  3/1991  Friedel et al. ............ 219/121.15 X

*Primary Examiner*—C. L. Albritton
*Attorney, Agent, or Firm*—Notaro & Michalos

[57] ABSTRACT

During the guiding and centering of an electron beam by means of a magnet field arranged orthogonally to the axis of the electron beam in a vacuum coating plant the signals which are decisive regarding the configuration and control of the magnet field or its axis of rotation, resp., are supplied by a detecting of the burning spot of the electron beam on the surface of the evaporation source by means of a video system, i.e. by means of a video camera resp. and a corresponding picture evaluated.

8 Claims, 2 Drawing Sheets

METHOD OF AN APPARATUS FOR A CENTERING OF AN ELECTRON BEAM

BACKGROUND OF THE INVENTION

1. Field of the Invention

The present invention relates to a method of guiding and centering an electron beam in a vacuum coating chamber by means of a magnet field which extends orthogonal to the axis of the electron beam, whereby the electron beam is guided in a vacuum chamber from a cathode to a source of raw material and a burning spot is produced thereat and where by means of the electron beam the surface of the source of raw material is heated and melted and the source of raw material is fed along corresponding to the melting off of the material.

The invention relates further to an apparatus for practicing the method.

2 Description of the Prior Art

Many different methods of allowing an evaporating of coating materials and of coating the surfaces of substrates by such materials in a vacuum chamber have become known. Also known is to introduce additional reactive gases such as Nitrogen or Oxygen into the vacuum chamber by means of which surface coatings of corresponding compounds are produced. The German Patent Specification Nr. 28 23 870 discloses such a method and such an apparatus. Thereby, a substrate support which supports the articles to be coated is arranged in a vacuum chamber concentrically around the main axis. These articles may be tools such as milling cutter or drills or other parts which are to be equipped with a surface coating which shall have specific mechanical, chemical or optical properties. An electron beam stemming from a cathode arrangement and impinging on the raw materials source is guided in the center of the apparatus along the longitudinal axis of the vacuum chamber. By means of the high energy of the electron beam the surface of the raw material source is melted and deposited onto the substrates in accordance with the described method. The electron beam is focussed by means of a magnet field and aligned onto the center of the vacuum chamber. The support of the substrates and the articles to be coated located at the support of the substrates distort this magnet field and the effect of these disturbances is that the electron beam is deflected and, therefore, the raw material source is no more acted upon in a manner as really desired. Additional difficulties arise when the support for the substrates or the articles to be coated rotate during the coating process or are otherwise moved. In such a case the influences onto the magnet field change continuously and the electron beam is deflected irregularly and is disturbed. The consequence of this behaviour is that the raw material source is irregularly acted upon and melted irregularly. In extreme cases it is even possible that the focal or burning spot produced by the electron beam impinges outside of the raw material source onto supporting structures there around which may lead in case of an unsufficient cooling to a damaging of these structures of the plant. At the known apparatus a raw material source is used which is located in a crucible which can contain only a certain limited amount of a coating material.

It is also known to place in apparatuses or plants, resp. having a high rate of evaporation a bar or rod as raw material source which can be continuously fed along through the bottom floor of the crucible. This raw material rod forms the anode and if the magnet field is not influenced, the burning spot formed by the electron beam impinges onto the center of the raw material rod and causes a uniform melting of the surface. If the electron beam is deflected away from the center, the rod will meltoff one-sided and a one-sided pasty or mellow, resp. collar is formed. This one-side collar is also cooled to a lesser extent because it is at a further distance from the cooled support. The pasty part of the collar reacts with the reactive gas present in the chamber and the compound produced thereby has mostly a higher melting point than the pure material. This leads to disturbances of the coating process because of such state the rate of evaporation is changed and the melting operation is disturbed. The consequence could be that the coating process must be interrupted and that, therefore, the articles to be coated are of a lesser quality or even must be removed as waste.

The object following from the above described situation, namely to allow the centering of the electron beam during the coating process in order to produce a uniform melting process at the surface of the raw material source forms the basis of the European Published Application EP-OS-0 381 912 in which a method of centering of the electron beam by means of a magnet field rotating laterally to the axis of the electron beam is proposed. This rotating magnet field can thereby be additionally superimposed by a steady magnet field for an additional influencing and positioning of the electron beam such to erode the entire surface of the raw material source uniformly. The controlling or influencing, resp. of the magnet field for the centering or guiding, resp. of the electron beam by means of a measuring of the rate of consumption of the reactive gas in the vacuuum chamber such as proposed in the European Specification EP-OS-0 381 912 has not proven itself and has revealed itself to be unreliable and led still to a nonuniform eroding of the raw material.

SUMMARY OF THE INVENTION

It is, therefore, a general object of the invention to provide an improved and more reliable control of the supply devices for the coils which generate the magnet fields in order to effect the centering or guiding, resp. of the electron beam by a suitable procedure.

A further object is to provide a method comprising the steps of detecting by means of a video system the deviation of the burning spot produced by means of the electron beam from the center of the source of raw material, and of utilizing the accordingly determined signals for the shaping of the magnet field for a guiding or centering, resp. of the electron beam.

Still a further object is to provide an apparatus comprising magnet coils located in a plane in the area of the electron beam, which magnet coils have axes which extend at least approximately perpendicular to the axis of the electron beam and at least perpendicular relative to each other; and comprising further a video system, said video system including a video camera located outside of the vacuum chamber, a window in the wall of the vacuum chamber allowing the view from the video camera onto the source of evaporation, which window is adapted to be closed, whereby the axis of the video camera is directed substantially onto the center point of the source of evaporation, and a picture evaluator which is coupled to a computer adapted to control the supply of the magnet coils.

By means of the inventive method it is possible to correct the deflection of the electron beam from the ideal axis due to the support for the substrates and the substrates themselves, or their influence onto the main magnet field, resp. This is achieved in that steady magnet fields transverse to the axis of the electron beam are generated, which magnet fields position the electron beam onto the center of the raw material source. The axes of the two magnet coils extend thereby perpendicular relative to each other and in a plane which extends substantially perpendicular relative to the axis of the electron beam. The magnet field generated in this manner compensates the influence on the main field produced by the ferromagnetic substrates. On the same axes on which the magnet coils for the stationary magnet fields are arranged a superimposed rotating magnet field may be generated which serves for an additional influencing and positioning of the electron beam or by means of which, resp. the electron beam is rotated around an axis of rotation at a certain radius. The rotating magnet field is generated by means of two coils offset by 90° which are supplied by alternating current at a phase quadrature, i.e. at a phase shift of 90°. The rotating magnet field may, however, also be generated by the two initially mentioned magnet coils in that these are additionally supplied with alternating current at a 90° phase shift. This additional rotating magnet field allows a displacing of the axis of rotation around which the electron beam rotates in the coordinate system formed by the two axes of the magnet coils until in the optimal case the axis of rotation is brought into alignment with the axis of the raw material source.

If in operation of the apparatus or plant, resp. the electron beam does not impact onto the center of the raw material source, for instance because the ferromagnetic substrates distort the main field generated by the coils, the axis of rotation around which the electron beam is rotated is also located outside the axis of rotation. Conclusively, the electron beam does not sweep over the entire surface of the raw material source and thus it will be melted or eroded, resp. in a non-uniform manner. In other words, the gas discharge by means of which the commodity of the evaporation source to be melted is heated, does not burn on the center of the source of evaporation. Conclusively, the hottest area is not concentrically at the center of the rod of the raw material source.

According to the inventive method now, a videa camera of a video system is aligned with the center of the rod of the raw material source. A picture evaluator is coupled to the video camera. This picture evaluator detects brightness signals above an adjustable threshold value and outputs for the area having a brightness above this threshold value signals which correspond to the coordinates of the center of highest brightness of this area, relative to the coordinate system of the video camera. In this manner the hottest area on the evaporisation source can be localized which area is not concentrically at the center of the rod. By means of the signals generated in the picture evaluator the supply devices of the orthogonal coils offset by 90° for the centering of the rotating magnet field or electron beam, resp. are controlled in such a manner that the area having the highest brightness comes to be located in the center of the source of evaporation. This centering operation of the electron beam can be made already ahead of the coating process and specifically for instance at one quarter of the total or process resp. output, such that the commodity to be melted is therewith heated only and not evaporated. Corresponding to the deviation detected by the video camera the rotating electron beam is displaced with the axis of rotation in direction of the axis of the raw material source until the axis of rotation is brought to coincide with the axis of the raw material source.

If a vertical movement of the crucible is needed for the process, i.e. a vertical movement of the source of evaporation, the centering for the bottom and top position of the crucible is made prior to the coating. The video camera is thereto pivoted to such an extent until the source of evaporation comes again to be located in the center of the picture. During the coating process the coils are operated by the currents determined during the centering procedure. The gas discharge burns now at full power on the center of the commodity to be melted. In order to achieve a more uniform melting-off of the rod, alternating currents are superimposed to the centering signal of the two coils such as mentioned above. The two alternating signals are also phase-shifted relative to each other by 90°. By the rotating field which is superimposed over the steady field the burning spot wanders around the center point of the rod and a uniform melting-off of the rod is secured. The burning spot circulates in this manner around the center of the rod of the raw material source.

This method allows an automatic controlling of such surface coating apparatuses, in which the electron beam is deflected from the optimal position by the substrates or substrate supports set thereinto. Because the method and the apparatus operate automatically, there is no need of an adjusting when other substrates or other arrangements are used in the area of the substrate support. By means of the electron beam which rotates around an axis it is possible to sweep the entire surface of the raw material source at a relatively small diameter of the electron beam and to reach a uniform melting and rate of evaporation. This arrangement allows also to employ raw material sources which dependet from the rate of the melting-off or evaporation, reps. can continuously be fed along. Decisive regarding the invention is, thereby, that prior to a respective setting into operation or start up, resp. of such a surface coating apparatus, the electron beam is aligned by means of the above disclosed, inventive method by using a video camera with the center of the rod of the raw material source.

BRIEF DESCRIPTION OF THE DRAWINGS

The invention will be better understood and objects other than those set forth above will become apparent when consideration is given to the following detailed description thereof. Such description makes reference to the annexed drawings, wherein.

DESCRIPTION OF THE PREFERRED EMBODIMENTS

Figure 1:
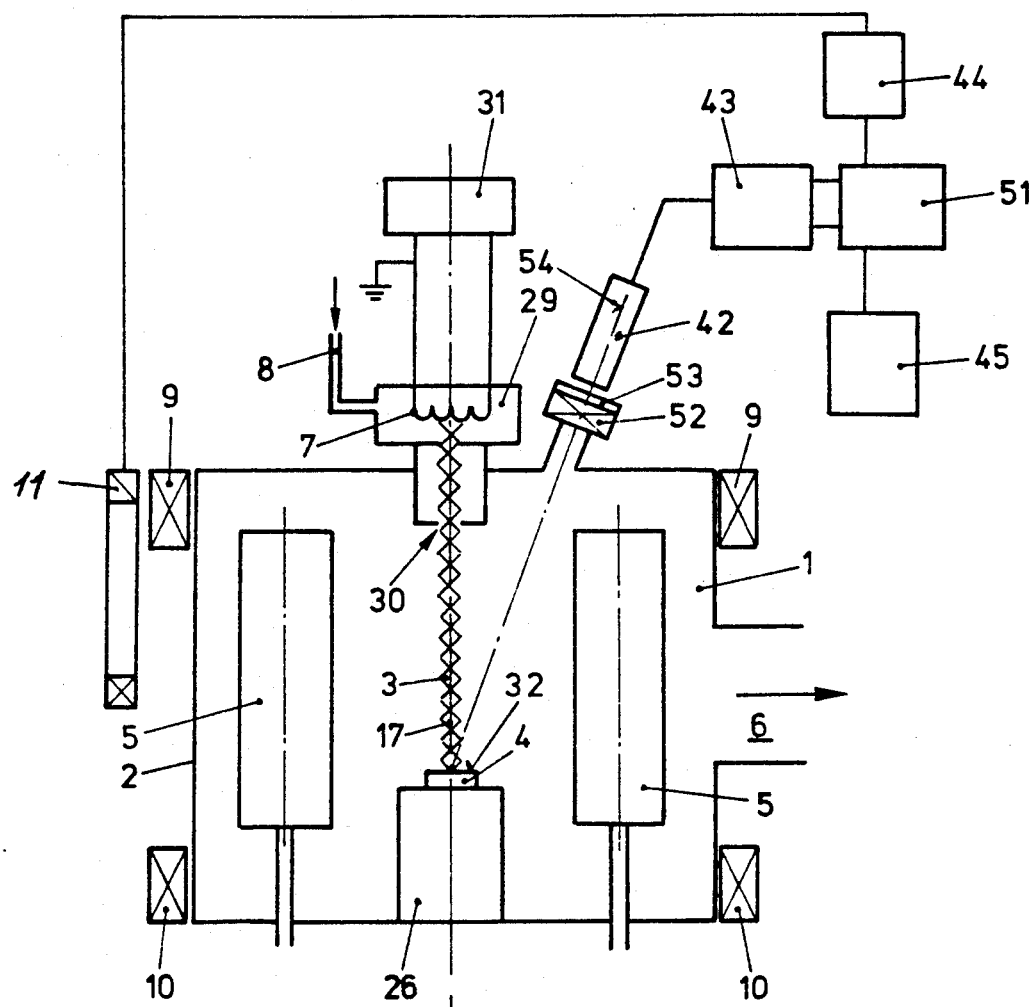
FIG. 1 is a schematic illustration of a longitudinal section through a vacuum coating apparatus structured in accordance with the present invention.
Figure 2:
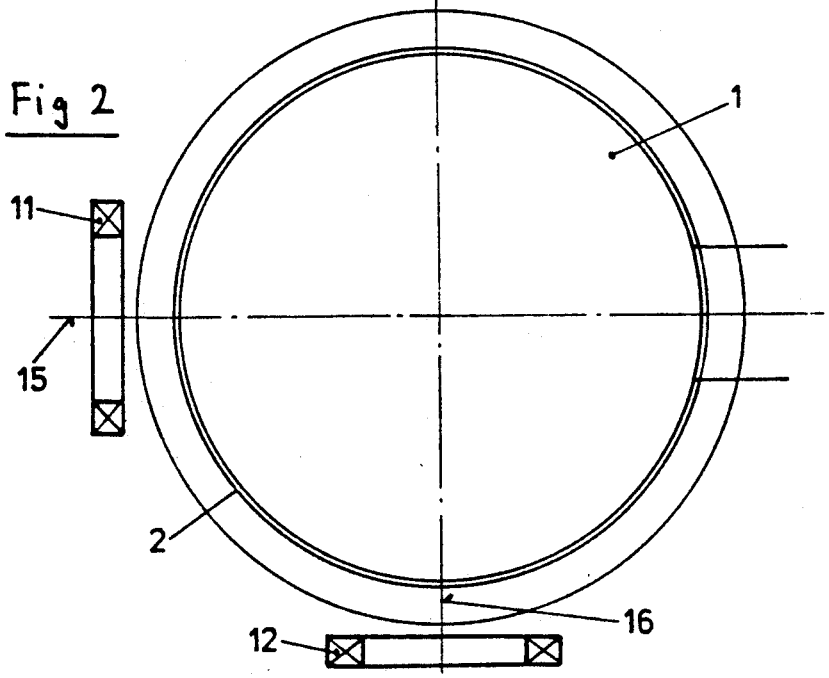
FIG. 2 illustrates the arrangement of the magnet coils needed for the centering of the electron beam.

The vacuum coating apparatus according to FIG. 1 and 2 consists of a casing 2 which encloses a vacuum chamber 1. Ferromagnetical substrates 5 of which the surfaces are to be coated are located in this vacuum chamber 1. The substrates 5 are according to a not specifically illustrated manner displaceable or moveable, resp. in order to guarantee an optimal coating of their surfaces. A glowing cathode chamber 29, having a cathode 7 and corresponding energy supply devices 31 are located at the upper part of the casing 2. The glowing cathode chamber 29 communicated via an opening 30 whith the vacuum chamber 1. A raw material source 4 is located at the bottom of the vacuum chamber 1. This raw material source is of a rod like shape and can be fed along in correspondance with the melted-off and evaporated amount of material. A feeding device 26 for this operation is mounted below the raw material source 4. An evacuating connection 6 is arranged at the casing 2, via which the desired vacuum can be produced in the vacuum chamber 1. A connection for a conduit 8 for reactive gas is located in the area of the cathode chamber 29 through which reactive gases, such as e.g. Acetylene, Nitrogen or Oxygen are fed which combine themselves with the evaporisation material in accordance with known processes. If, for instance, a raw material source 4 of Titanium is used and Nitrogen is fed via the reactive gas conduit 8 thereto, it is possible to produce Titanium-Nitride compounds, or by an additional feeding of Azetylene a Titanium-Carbonitride-Coating which are specifically suitable for coatings of tools. In operation of the plant an electron beam 3 is produced between the cathode 7 and the surface of the raw material source 4, which beam melts the surface of the raw material source 4 and evaporates its material into the vacuum chamber 1.

In order to guide the electron beam 3 magnet coils 9 and 10 are mounted to the casing 2 which generate a magnet field extending parallel to the axis 17 of the electron beam 3. The electron beam 3 is focussed and guided by means of this magnet field. Depending from the properties, the shape and size, as well, of the substrates or articles, resp. to be coated the flux of the magnet field generated by the coils 9 and 10 is influenced and the electron beam 3 is accordingly deflected off the theoretical axis 17. The result thereof is that the burning spot produced by the electron beam 3 on the surface of the raw material source 4 does no longer impact onto the center of the raw material source 4 and thus causes a non-uniform melting-off of the raw material source 4. A further consequence is that the pasty or mellow, resp. edge areas which are unsufficiently heated react with the reactive gas and thus form compounds which melt only at a higher melting point. This influences negatively the mode of operation and efficiency of the coating apparatus to a considerable extent. After a certain duration the feeding of the raw material source 4 by means of the feeding device 26 must be interrupted because a super-elevated collar is built up at the area of the surface 32 of the raw material source 4 which is no longer properly heated by the electron beam 3.

In order to prevent these disturbances or to correct, resp. the course of the electron beam additional magnets 11 (X-coil) and 12 (Y-coil) are arranged at the inventive apparatus. According to the illustrated example these magnet coils are mounted outside of the casing 2, and specifically in a plane which extends substantially perpendicular to the axis 17 of the electron beam 3. The axes 15 and 16 of these coils 11 and 12 extend in a same common plane and extend at an angle of 90° relative to each other.

A video camera 42 is, furthermore, located in the inventive apparatus, and is aligned with the center of the rod of the evaporation source 4 through a window like opening 53 and a valve 52. The video camera 42 is supported for a pivoting around its axis of rotation 54. A picture evaluator 43 is coupled to the video camera 42. This picture evaluator 43 detects brightness signals higher than a settable threshold value and outputs for the area of a brightness above or higher than, resp. this threshold value signals, which correspond to the coordinates of the spot of highest intensity of this area in relation to the coordinate system of the video camera. In this manner the hottest area on the surface of the evaporation source 4 which is produced by the gas discharge or the heating, resp. of the evaporation source 4 by means of the electron beam is detected by the video camera 42. Via a computer 51 which is coupled to the picture evaluator 43 and via the supply devices 44 and 45 the centering coils 11 and 12 arranged orthogonally relative to each other are controlled in such a manner, or the additional magnet field for the correcting of the electron beam is generated in such a manner, resp. that the area with the highest brightness comes to be located at the center of the evaporation source 4. This centering procedure by means of the video camera is made preferably prior to the coating process, whereby it can be made at less of a quarter of the total or full load output, resp. In this manner the commodity 4 to be melted is only heated but not evaporated. Due to the fact that the video camera 42 is supported to pivot around its axis 54 it is possible to adjust the camera 42 upon a vertical movement of the evaporation source 4 to the respective corresponding position of the surface, such that the video camera is aimed in any case at the center of the evaporation source 4. During the coating operation the coils are operated by the currents determined by the centering process. The gas discharge burns now with its full output onto the center of the commodity 4 to be melted. In order to achieve a uniform melting of the commodity 4 to be melted alternating signals are superimposed over the centering signal of the two coils 11 and 12. Due to the rotating field which is superimposed over the stationary field the burning spot moves around the center point of the evaporation source 4 and a uniform melting-off of the rod is secured. This superimposing is produced either by additional magnet coils arranged parallel to the magnet coils 11 and 12, or these further magnet coils are respective parts of the magnet coils 11 and 12. In this manner the burning spot is circulated about 4 times each minute around the center.

Figure 3:
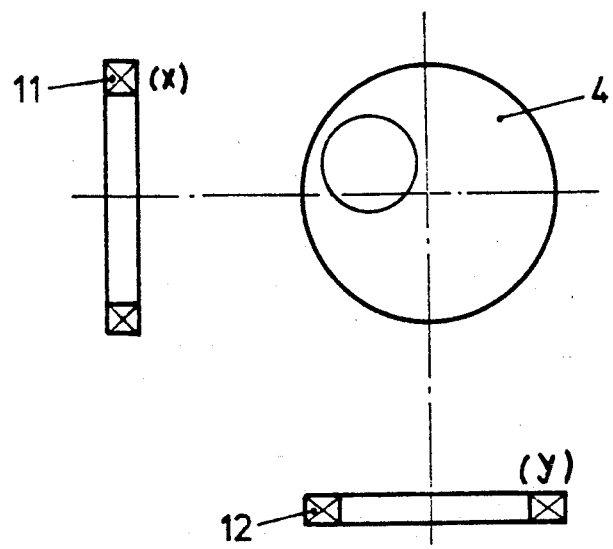
FIGS. 3 to 5 illustrate schematically the influence of the magnet field onto the position of the burning spot on the evaporation source.
Figure 4:
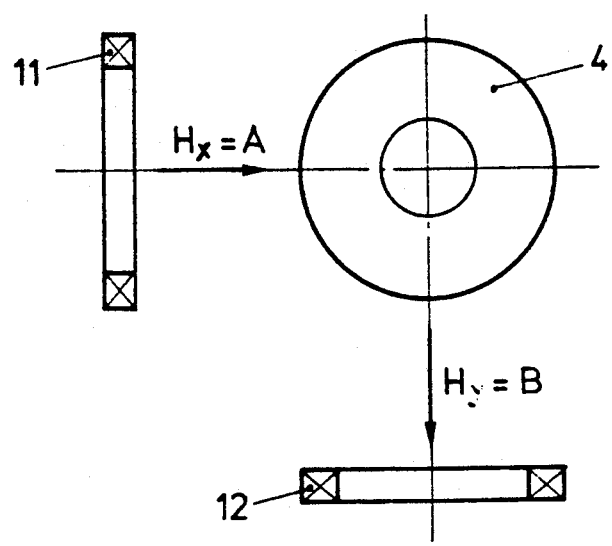
Figure 5:
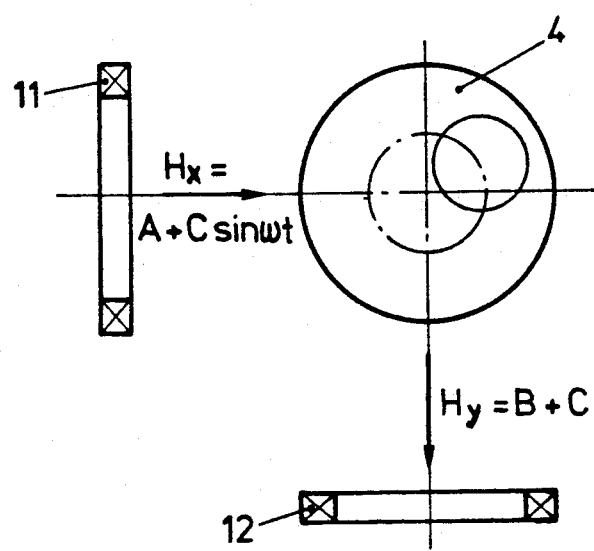

The influence of the magnet fields onto the electron beam or onto the burning spot produced on the surface of the commodity 4 to be melted, resp. is illustrated in FIGS. 3, 4 and 5.

FIG. 3 depicts the position of the burning spot on the surface of the commodity 4 to be melted, where the course of the electron beam is not corrected.

In FIG. 4 the electron beam is corrected or centered, resp. by the steady fields of the coils 11 and 12 (X and Y-coil).

In FIG. 5 the burning spot is at the one side corrected by the steady field and is, furthermore, superimposed by an alternating field in such a manner that the burning spot conducts on the surface of the evaporation source a rotationals movement in the direction of the arrow.

The embodiment of an inventive apparatus, or schematically illustrated practice of an inventive method, resp. depicted in FIGS. 1-5 are obviously not restricted to same, but can be changed or modified in any manner. Decisive for the inventive method is that the position of the burning spot on a evaporation source is detected by means of a video camera and is thereafter corrected by means of additional magnet coils extending orthogonally to each other in such a manner, that the burning comes to be positioned in the center of the evaporation source.

While there are shown and described present preferred embodiments of the invention it is to be distinctly understood that the invention is not limited thereto, but may be otherwise variously embodied and practiced within the scope of the following claims.

We claim:

1. A method of guiding an electron beam in a vacuum coating chamber by means of a magnet field which extends orthogonal to the axis of the electron beam, whereby the electron beam is guided in a vacuum chamber from a cathode to a source of raw material and a burning spot is produced thereat and by means of the electron beam the surface of the source of raw material is heated and melted and the source of raw material is fed along corresponding to the melting-off of the material, comprising the steps of detecting by means of a video system the deviation of the burning spot produced by means of the electron beam from the center of the source of raw material, and of utilizing the accordingly determined signals for the conditioning of the magnet field for a guiding of the electron beam.

2. The method of claim, 1, wherein two crossed magnet coils are utilized for guiding the electron beam.

3. The method of claim 1, wherein the raw material is rod shaped, said video system comprising a video camera which is aligned with the center of the rod shaped raw material, which video camera is coupled to a picture evaluator adapted to detect signals of brightness on the surface of the raw material source, by means of which picture evaluator brightness signals above an adjustable threshold value are detected or determined, whereby the supply apparatuses of the orthogonally arranged magnet coils are controlled by means of said signals via a computer in such a manner, that the location of the highest brightness on the surface of the raw material is made to be located at the center of the source of evaporation at the raw material.

4. The method of claim 1, wherein the electron beam is operated at a reduced output, such that the melted matter at the source of evaporation is only heated but does not evaporate.

5. The method of claim 3, wherein said video camera is pivotably supported for enabling an adjusting following a displacement of the raw material source.

6. The method of claim 1, wherein said magnet field is superimposed by a rotating magnet field generated by an alternating signal in order to cause a rotation of the electron beam about the axis of the raw material source, whereby a uniform melting-off of the source of raw material is arrived at.

7. The method of claim 6, wherein the axis of the rotational movement is caused to coincide with the axis of the raw material source.

8. An apparatus for guiding and centering an electron beam in a vacuum coating chamber by means of a magnet field which extends orthogonal to the axis of the electron beam, including a cathode adapted to emit an electron beam which is guided in a vacuum chamber from said cathode to a source of raw material to produce a burning spot on the raw material, of which raw material the surface is heated and melted and which raw material is adapted to be fed along corresponding to the melting-off of the material, comprising magnet coils located in a plane in the area of the electron beam, which magnet coils have axes which extend at least approximately perpendicular to the axis of the electron beam and at least approximately perpendicular relative to each other; and comprising further a video system, said video system including a video camera located outside of said vacuum chamber, a window in the wall of said vacuum chamber allowing a view from said video camera onto the source of evaporation, which window is adapted to be closed, whereby the axis of said video camera is directed substantially onto the center point of the source of evaporation, a picture evaluator which is coupled to a computer adapted to control the supply of said magnet coils.

* * * * *